US012690338B2

(12) United States Patent
Kim et al.

(10) Patent No.: US 12,690,338 B2
(45) Date of Patent: Jul. 21, 2026

(54) ORGANIC LIGHT-EMITTING DISPLAY APPARATUS

(71) Applicant: Samsung Display Co., Ltd., Yongin-Si (KR)

(72) Inventors: Sunho Kim, Yongin-si (KR); Juchan Park, Yongin-si (KR); Sunhee Lee, Yongin-si (KR); Gunhee Kim, Yongin-si (KR); Taehoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/533,112

(22) Filed: Dec. 7, 2023

(65) Prior Publication Data

US 2024/0107820 A1      Mar. 28, 2024

Related U.S. Application Data

(63) Continuation of application No. 17/358,087, filed on Jun. 25, 2021, now Pat. No. 11,877,477.

(30) Foreign Application Priority Data

Aug. 26, 2020      (KR) ......................... 10-2020-0107967

(51) Int. Cl.
H10K 59/122           (2023.01)
H10K 59/121           (2023.01)
(Continued)

(52) U.S. Cl.
CPC ....... H10K 59/122 (2023.02); H10K 59/1213 (2023.02); H10K 59/126 (2023.02); H10K 59/353 (2023.02)

(58) Field of Classification Search
CPC . H10K 59/122; H10K 59/1213; H10K 59/353
(Continued)

(56) References Cited

U.S. PATENT DOCUMENTS 8,508,438 B2     8/2013   Suh
10,095,272 B2    10/2018  Park et al.
(Continued)

FOREIGN PATENT DOCUMENTS

CN          110874990 A      3/2020
CN          111180501 A      5/2020
(Continued)

OTHER PUBLICATIONS

Chinese Office Action mailed May 1, 2026, issued in related Chinese Application No. 202110979680.6, 11 pages.

*Primary Examiner* — Dzung Tran
(74) *Attorney, Agent, or Firm* — Innovation Counsel LLP

(57) ABSTRACT

Provided is an organic light-emitting display apparatus in which a dead space may be reduced. The organic light-emitting display apparatus includes: a substrate including a first display area, a second display area disposed outside of the first display area, and a third display area disposed outside of the second display area; a first thin-film transistor disposed in the first display area on the substrate; a second thin-film transistor and a third thin-film transistor each arranged in the second display area on the substrate; a first pixel electrode arranged in the first display area on the substrate and electrically connected to the first thin-film transistor; a second pixel electrode arranged in the second display area on the substrate and electrically connected to the second thin-film transistor; and a third pixel electrode arranged in the third display area on the substrate and electrically connected to the third thin-film transistor.

10 Claims, 10 Drawing Sheets

(51) Int. Cl.
H10K 59/126 (2023.01)
H10K 59/35 (2023.01)

(58) Field of Classification Search
USPC .......................................................... 257/72
See application file for complete search history.

(56) References Cited

U.S. PATENT DOCUMENTS

| | | | |
|---|---|---|---|
| 10,311,774 B2 | 6/2019 | Park et al. | |
| 2010/0134389 A1* | 6/2010 | Jung ...................... | H10K 59/12 |
| | | | 345/82 |
| 2010/0155578 A1 | 6/2010 | Matsumoto | |
| 2016/0111479 A1 | 4/2016 | Kim et al. | |
| 2017/0162111 A1 | 6/2017 | Kang et al. | |
| 2017/0162606 A1 | 6/2017 | Yan et al. | |
| 2017/0287381 A1 | 10/2017 | Park et al. | |
| 2018/0122298 A1* | 5/2018 | Lee ...................... H01L 27/124 |
| 2018/0138256 A1 | 5/2018 | Han et al. | |
| 2019/0088733 A1 | 3/2019 | Cho et al. | |
| 2019/0103455 A1 | 4/2019 | Song et al. | |
| 2019/0108793 A1 | 4/2019 | Kim et al. | |
| 2019/0355301 A1 | 11/2019 | Lee | |
| 2020/0006370 A1 | 1/2020 | Huo et al. | |
| 2020/0098835 A1 | 3/2020 | Bae et al. | |

FOREIGN PATENT DOCUMENTS

| | | | |
|---|---|---|---|
| CN | 210516728 U | 5/2020 | |
| JP | 2010-153449 A | 7/2010 | |
| KR | 10-2017-0047446 A | 5/2017 | |
| KR | 1020170065059 A | 6/2017 | |
| KR | 10-2017-0115182 A | 10/2017 | |
| KR | 10-2019-0032711 A | 3/2019 | |
| KR | 10-2019-0036461 A | 4/2019 | |
| KR | 10-2020-0034290 A | 3/2020 | |

* cited by examiner

ORGANIC LIGHT-EMITTING DISPLAY APPARATUS

CROSS-REFERENCE TO RELATED APPLICATION

This application is a continuation application of U.S. patent application Ser. No. 17/358,087 filed on Jun. 25, 2021, which claims priority under 35 U.S.C. § 119 to Korean Patent Application No. 10-2020-0107967, filed on Aug. 26, 2020, in the Korean Intellectual Property Office, the disclosures of which are incorporated herein in their entirety by reference.

BACKGROUND

1. Field

One or more embodiments relate to an organic light-emitting display apparatus, and more particularly, to an organic light-emitting display apparatus in which a dead space is reduced.

2. Description of Related Art

Generally, a display apparatus includes a plurality of pixels, and each of the plurality of pixels includes a display element and a pixel circuit configured to control the display element. The pixel circuit includes a thin-film transistor (TFT), a storage capacitor, and the like. In addition, the display apparatus also includes circuits for transmitting electrical signals to the display element at the periphery of a substrate.

SUMMARY

However, such a display apparatus according to the related art has a drawback in that an area of a dead space thereof is large due to circuits or the like at the periphery of a substrate.

One or more embodiments include an organic light-emitting display apparatus in which an area of a dead space thereof may be reduced. However, this is only an example, and the scope of embodiments is not limited thereby.

Additional aspects will be set forth in part in the description which follows and, in part, will be apparent from the description, or may be learned by practice of the presented embodiments of the disclosure.

According to an embodiment, an organic light-emitting display apparatus includes a substrate comprising a first display area, a second display area disposed outside of the first display area, and a third display area disposed outside of the second display area, a first thin-film transistor disposed in the first display area on the substrate, a second thin-film transistor and a third thin-film transistor each arranged in the second display area on the substrate, a first pixel electrode arranged in the first display area on the substrate and electrically connected to the first thin-film transistor, a second pixel electrode arranged in the second display area on the substrate and electrically connected to the second thin-film transistor, and a third pixel electrode arranged in the third display area on the substrate and electrically connected to the third thin-film transistor.

The third pixel electrode may extend to the second display area and be electrically connected to the third thin-film transistor in the second display area.

The organic light-emitting display apparatus may further include a driver circuit disposed in the third display area, and the third pixel electrode overlaps the driver circuit in a plan view.

The organic light-emitting display apparatus may further include a shielding layer disposed between the driver circuit and the third pixel electrode.

A constant voltage may be applied to the shielding layer.

The organic light-emitting display apparatus may further include a common electrode disposed above each of the first pixel electrode, the second pixel electrode, and the third pixel electrode, and an electrode power supply line electrically connected to the common electrode, and the electrode power supply line is electrically connected to the shielding layer.

The organic light-emitting display apparatus may further include a common electrode disposed above each of the first pixel electrode, the second pixel electrode, and the third pixel electrode, and an electrode power supply line electrically connected to the common electrode, and the shielding layer is a portion of the electrode power supply line.

A plurality of the first pixel electrode may be provided in the first display area, a plurality of the second pixel electrode is provided in the second display area. The number of the first pixel electrodes per unit area in the first display area may be greater than the number of the second pixel electrodes per unit area in the second display area.

A plurality of the third pixel electrode may be provided in the third display area, and the number of the second pixel electrodes per unit area in the second display area may be equal to or greater than the number of the third pixel electrodes per unit area in the third display area.

An area of the second pixel electrode may be greater than an area of the first pixel electrode.

An area of the third pixel electrode may be greater than an area of the first pixel electrode.

The organic light-emitting display apparatus may further include a pixel-defining layer that covers the first pixel electrode, the second pixel electrode and the third pixel electrode, the pixel-defining layer including a first opening exposing a central portion of the first pixel electrode, a second opening exposing a central portion of the second pixel electrode, and a third pixel opening exposing a central portion of the third pixel electrode.

An area of the second opening may be greater than an area of the first opening.

An area of the third opening may be greater than an area of the first opening.

The area of the third opening may be equal to an area of the second opening.

A plurality of the second pixel electrode may be provided in the second display area and the second pixel electrodes may be uniformly arranged in the second display area.

A plurality of the third pixel electrode may be provided in the third display area, and the third pixel electrodes may be uniformly arranged in the third display area.

The second display area may surround the first display area, and the third display area may surround the second display area.

A plurality of the third pixel electrode may be provided in the third display area. The second display area may include a 2-1$^{st}$ display area abutting to one side of the first display area, and a 2-2$^{nd}$ display area abutting to another side of the first display area, the another side of the first display area being opposite to the one side of the first display area with respect to a center of the first display area. The third display area may include a 3-1$^{st}$ display area such that the 2-1$^{st}$ display area is disposed between the first display area and the 3-1$^{st}$ display area, and a 3-2$^{nd}$ display area such that the 2-2$^{nd}$ display area is disposed between the first display area and the 3-2$^{nd}$ display area. The third display area may further include a first driver circuit in the 3-1$^{st}$ display area, and a second driver circuit in the 3-2$^{nd}$ display area. Part of the third pixel electrodes may be disposed above the first driver circuit to overlap the first driver circuit in a plan view and the rest of the third pixel electrodes may be disposed above the second driver circuit to overlap the second driver circuit in a plan view.

Other aspects, features, and advantages other than those described above will become apparent from the detailed content, claims and drawings for carrying out the following embodiments.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
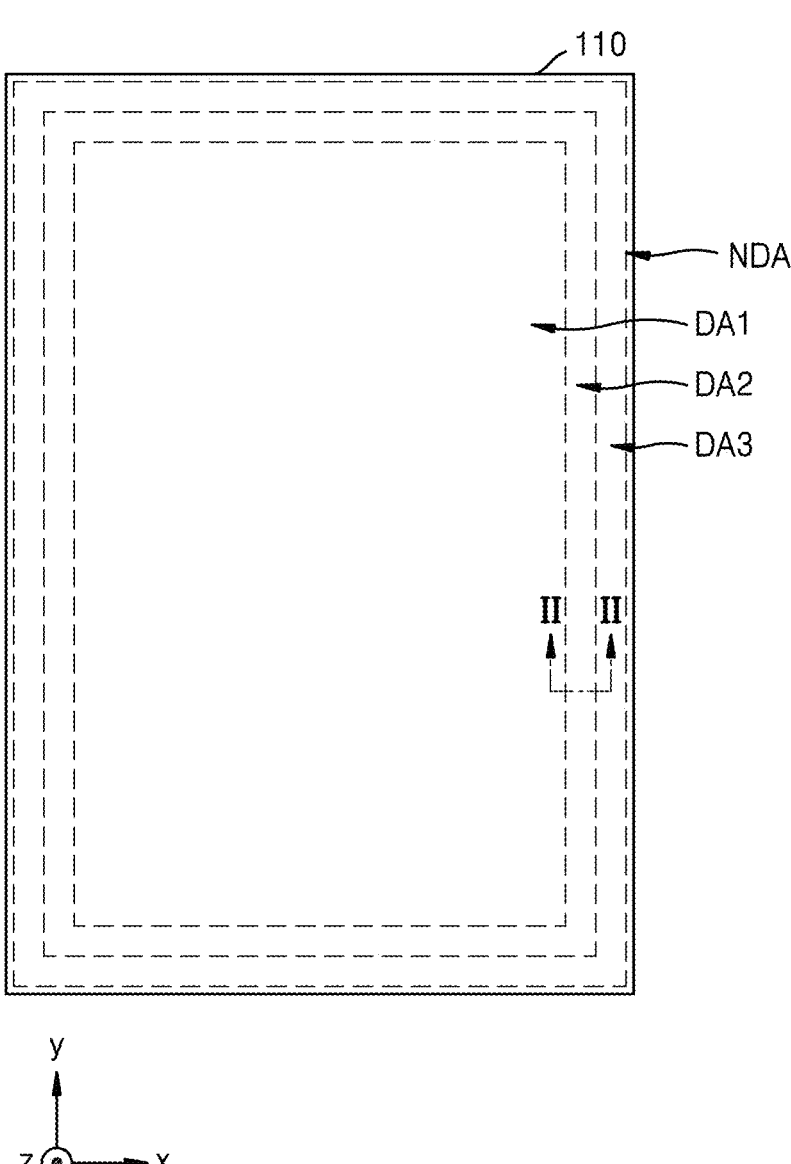
FIG. 1 is a plan view schematically illustrating a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, certain embodiments are illustrated in the drawings and are described in the detailed description. Effects and characteristics of the present disclosure, and a method of accomplishing the same will become apparent and more readily appreciated from the following description of the embodiments and the accompanying drawings. However, the present disclosure is not limited to embodiments below and may be implemented in various forms.

Hereinafter, embodiments are described in detail with reference to the accompany drawings. When description is made with reference to the drawings, like reference numerals are given to like or corresponding elements, and repeated descriptions thereof are omitted.

In the following embodiments, it will be understood that when a component, such as a layer, a film, a region, or a plate, is referred to as being "on" another component, the component can be directly on the other component or intervening components may be present therebetween. Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view schematically illustrating a portion of a display apparatus according to an embodiment.

The display apparatus according to the present embodiment may include electronic apparatuses such as smartphones, mobile phones, navigation apparatuses, game consoles, televisions (TV), head-up displays for an automobile, notebook computers, laptop computers, tablet computers, personal multimedia players (PMP), and personal digital assistants (PDA). In addition, an electronic apparatus may include flexible apparatuses.

As shown in FIG. 1, the display apparatus according to the present embodiment includes a first display area DA1, a second display area DA2, a third display area DA3, and a non-display area NDA. That is, a substrate 100 (see FIG. 2) included in the display apparatus includes the first display area DA1, the second display area DA2 and the third display area DA3. The second display area DA2 surrounds the first display area DA1 and the third display area DA3 surrounds the second display area DA2 in a plan view. The non-display area NDA surrounds the third display area DA3.

FIG. 1 illustrates that the display apparatus has a substantially rectangular shape in a plan view (when seen from a direction perpendicular to a display surface or when seen from a direction perpendicular to an upper surface of the substrate 100), but embodiments are not limited thereto. The display apparatus is not limited to having a rectangular shape in a plan view as shown in FIG. 1 and may have various shapes such as a circle and the like. In addition, the substrate 100 may include a bent area and accordingly, be bent in the relevant bent area.

The substrate 100 may include glass or metal. In addition, the substrate 100 may include a variety of flexible or bendable materials, such as polyethersulphone, polyacrylate, polyetherimide, polyethylene naphthalate, polyethylene terephthalate, polyphenylene sulfide, polyarylate, polyimide, polycarbonate, or polymer resin such as cellulose acetate propionate.

The substrate 100 may have a multi-layered structure including two layers and a barrier layer disposed therebetween. The two layers may include the above polymer resin and the barrier layer including an inorganic material. The substrate 100 may be variously modified. In this case, the barrier layer may include silicon oxide, silicon nitride, and/or silicon oxynitride.

Display elements may be disposed in each of the first display area DA1, the second display area DA2, and the third display area DA3. For example, a display element may be an organic light-emitting diode (OLED) and may emit red, green, blue, or white light. A thin-film transistor, a capacitor, or the like for controlling the degree of emission of the OLED are disposed on the substrate 100.

Figure 2:
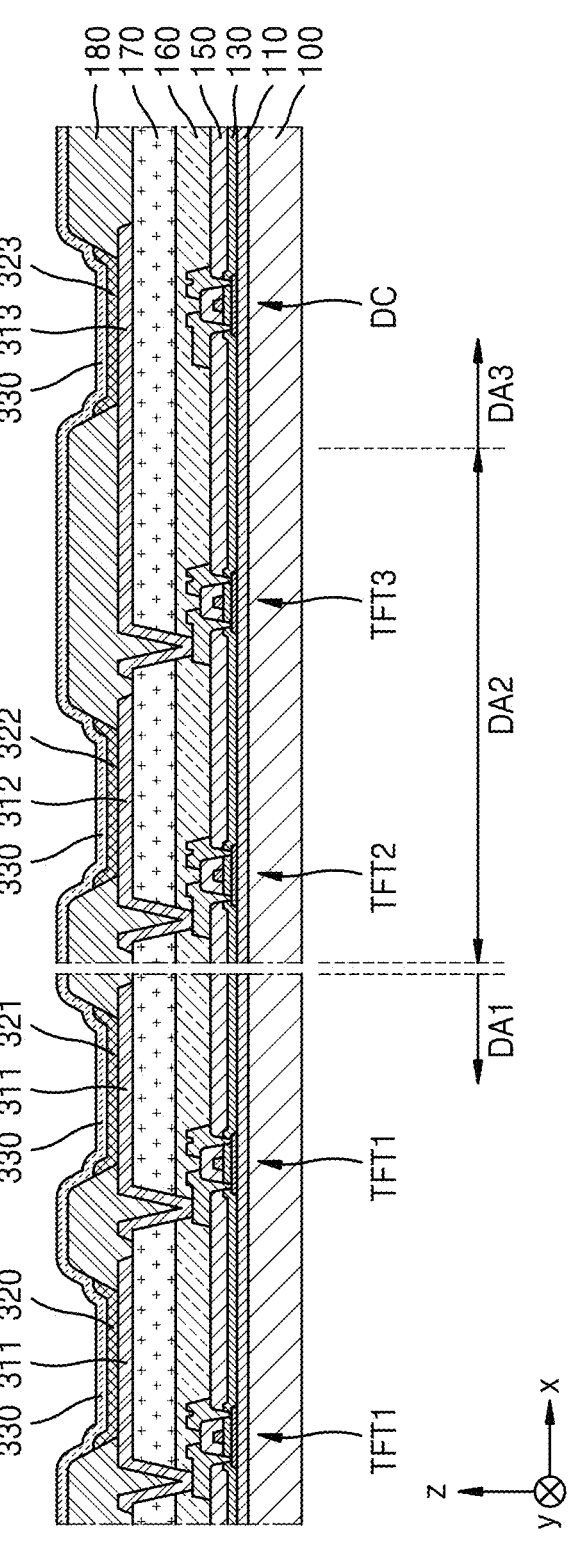
FIG. 2 is a cross-sectional view schematically illustrating a cross-section of the display apparatus in FIG. 1 taken along line II-II.

FIG. 2 is a cross-sectional view schematically illustrating a cross-section of the display apparatus taken along line II-II in FIG. 1. In the cross-sectional view of FIG. 2, the sizes of the elements are exaggerated and/or reduced, for convenience. This is also applied to cross-sectional views below.

As shown in FIG. 2, a first thin-film transistor TFT1 is in the first display area DA1, and a second thin-film transistor TFT2 and a third thin-film transistor TFT3 are in the second display area DA2. These first thin-film transistor TFT1 to third thin-film transistor TFT3 each include a semiconductor layer.

The semiconductor layer may be formed on the substrate 100. A buffer layer 110 may be formed on the substrate 100 and the semiconductor layer may be formed on the buffer layer 110.

The buffer layer 110 may reduce or block penetration of foreign matter, moisture, or ambient air from the bottom of the substrate 100 and may provide a flat surface on the substrate 100. The buffer layer 110 may include an inorganic material such as oxide or nitride, an organic material, or an organic/inorganic composite material and include a single layer or a multi-layer including an inorganic material and an organic material. For example, the buffer layer 110 may have a structure in which a first buffer layer and a second buffer layer are stacked, and in this case, the first buffer layer and the second buffer layer may include different materials. For example, the first buffer layer may include silicon nitride, and the second buffer layer may include silicon oxide.

As described above, when the first buffer layer includes silicon nitride, hydrogen may be included in the first buffer layer while silicon nitride is formed. Through this, the carrier mobility of the semiconductor layer formed on the buffer layer 110 improves, and thus, an electric characteristic of a thin-film transistor may improve. In addition, the semiconductor layer may include silicon. In this case, an adhesion between the semiconductor layer including silicon and the second buffer layer including silicon oxide improves, and thus, an electric characteristic of a thin-film transistor may improve.

The semiconductor layer may include low temperature poly-silicon (LTPS). Low temperature Poly-silicon may have high electron mobility (of more than 100 cd/Vs), low energy consumption, and excellent reliability. As another example, the semiconductor layer may include amorphous silicon (a-Si) and/or an oxide semiconductor. Alternatively, some of semiconductor layers of a plurality of thin-film transistors may include an LTPS, and others may include amorphous silicon and/or an oxide semiconductor.

A gate insulating layer 130 is disposed on the semiconductor layer, and gate electrodes respectively included in the first thin-film transistor TFT1 to the third thin-film transistor TFT3 and various wirings (not shown) may be disposed on the gate insulating layer 130. The gate insulating layer 130 may include silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO).

Conductive layers, for example, the gate electrodes may be disposed on the gate insulating layer 130. The gate electrodes included in the first thin-film transistor TFT1 to the third thin-film transistor TFT3 may each include a conductive material including molybdenum (Mo), aluminum (Al), copper (Cu), and titanium (Ti), and may have a multi-layer structure or single layer structure including the above material. For example, the gate electrodes included in the first thin-film transistor TFT1 to the third thin-film transistor TFT3 may have a Mo/Al multi-layer structure or a Mo/Al/Mo multi-layer structure.

An interlayer insulating layer 150 is disposed over the conductive layers on the gate insulating layer 130 as well as the gate electrodes included in the first thin-film transistor TFT1 to the third thin-film transistor TFT3. The interlayer insulating layer 150 may include SiO$_2$, SiN$_x$, SiON, Al$_2$O$_3$, TiO$_2$, Ta$_2$O$_5$, HfO$_2$, or ZnO. When necessary, an inorganic insulating layer covering the gate electrodes included in the first thin-film transistor TFT1 to the third thin-film transistor TFT3 and the conductive layers on the gate insulating layer 130 may be further disposed on the gate electrodes included in the first thin-film transistor TFT1 to the third thin-film transistor TFT and the conductive layers disposed on the gate insulating layer 130, and the interlayer insulating layer 150 may be disposed on the inorganic insulating layer. In this case, a conductive layer may also be disposed between the inorganic insulating layer and the interlayer insulating layer 150, and the conductive layer may have, for example, a multi-layer structure of Mo/Al or a multi-layer structure of Mo/Al/Mo.

Data lines and power voltage lines may be disposed on the interlayer insulating layer 150. As shown in FIG. 2, source electrodes and drain electrodes of the first thin-film transistor TFT1 to the third thin-film transistor TFT3 may also be disposed on the interlayer insulating layer 150. Portions of a connection metal or wiring are disposed on the interlayer insulating layer 150, and some of these connection metal or wiring may be regarded as source electrodes and drain electrodes of the first thin-film transistor TFT1 to the third thin-film transistor TFT3. The conductive layers on the interlayer insulating layer 150 may include a conductive material including molybdenum (Mo), aluminum (Al), copper (Cu), or titanium (Ti), and may have a single or multi-layer structure including the above material. For example, the source electrodes and the drain electrodes of the first thin-film transistor TFT1 to the third thin-film transistor TFT3 may have a Ti/Al/Ti multi-layer structure.

The conductive layers disposed on the interlayer insulating layer 150 are covered with a protective layer 160. The protective layer 160 is a general purpose polymer such as benzocyclobutene (BCB), polyimide, hexamethyldisiloxane (HMDSO), poly(methyl methacrylate) (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymers, a vinyl alcohol-based polymer, or blends thereof. However, the protective layer 160 may be formed of an inorganic material, and in this case, may include SiO$_2$, SiN$_x$, SiON, Al$_2$O$_3$, TiO$_2$, Ta$_2$O$_5$, HfO$_2$, or ZnO.

A conductive layer may be disposed on the protective layer 160 as needed. In FIG. 2, such a conductive layer is omitted for convenience of explanation. The conductive layer on the protective layer 160 may be a bridge connecting conductive layers below the protective layer 160 to each other, or may be a bridge connecting a conductive layer below the protective layer 160 to a conductive layer above the protective layer 160. The bridge may include a conductive material including Mo, Al, Cu, and Ti and have a single-layered structure or a multi-layered structure including the above material. For example, the bridge on the protective layer 160 may have a multi-layer structure of Ti/Al/Ti.

A planarization layer 170 may be disposed on the bridge (not shown), and an OLED may be disposed on the planarization layer 170. That is, a first pixel electrode 311, a second pixel electrode 312, and a third pixel electrode 313 may be disposed on the planarization layer 170. The planarization layer 170 may have a flat top surface so that the first pixel electrode 311, the second pixel electrode 312, and the third pixel electrode 313 are formed flat. The planarization layer 170 may include an organic material and have a single-layered structure or a multi-layered structure. The planarization layer 170 may include a commercial polymer such as BCB, polyimide, HMDSO, PMMA, or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 170 may include an inorganic material. The planarization layer 170 may include $SiO_2$, $SiN_x$, SiON, $Al_2O_3$, $TiO_2$, $Ta_2O_5$, $HfO_2$, or ZnO. When the planarization layer 170 includes an inorganic material, chemical mechanical polishing may be performed in some cases. Moreover, the planarization layer 170 may include both organic and inorganic materials.

An OLED in the first display area DA1 may include the first pixel electrode 311, a common electrode 330, and a first intermediate layer 320 or 321 disposed therebetween and including an emission layer. An OLED in the second display area DA2 surrounding the first display area DA1 may include the second pixel electrode 312 and the common electrode 330, and a second intermediate layer 322 disposed therebetween and including an emission layer. An OLED in the third display area DA3 surrounding the second display area DA2 may include the third pixel electrode 313, the common electrode 330, and a third intermediate layer 323 disposed therebetween and including an emission layer. That is, the common electrode 330 may be integrally formed over the first display area DA1 to the third display area DA3.

Each of the first pixel electrode 311 to the third pixel electrode 313 may include a reflective layer including Ag, Mg, Al, Pt, Pd, Au, Ni, Nd, Jr, Cr, or a compound thereof, and a transparent or semi-transparent electrode layer formed thereon. The transparent or semi-transparent electrode layer may include at least one selected from the group consisting of ITO, IZO, ZnO, $In_2O_3$, IGO, and AZO. For example, the first pixel electrode 311 to the third pixel electrode 313 may each have a stack structure of ITO/Ag/ITO.

A pixel-defining layer 180 may be disposed on the planarization layer 170 on the first pixel electrode 311 to the third pixel electrode 313, and may have openings to respectively expose central portions of the first pixel electrode 311 to the third pixel electrode 313, thereby defining a light-emitting area of a pixel. Also, the pixel-defining layer 180 may increase a distance between an edge of each of the first to third pixel electrodes 211 to 231 and the common electrode 330 disposed thereon, and thus, arcs may be prevented from occurring at the edge of the first pixel electrode 311 to the third pixel electrode 313. The pixel-defining layer 180 is an organic insulating material such as polyimide, polyimide, acrylic resin, BCB, HMDSO, and phenol resin, and may be formed by a method such as spin coating or the like.

The first intermediate layer 320 or 321, the second intermediate layer 322, and the third intermediate layer 323 may each include an organic emission layer. The organic emission layer may include an organic material including a fluorescent or phosphorescent material that emits red, green, blue, or white light. The organic emission layer may include a low molecular weight organic material or a high molecular weight organic material. A functional layer such as a hole transport layer (HTL), a hole injection layer (HIL), an electron transport layer (ETL), an electron injection layer (EIL), and the like may be further disposed below and above the organic emission layer. The functional layer included in the first intermediate layer 320 or 321, the second intermediate layer 322, and the third intermediate layer 323, for example, the HTL, the HIL, the ETL, and/or the EIL, may be integrally formed over the first pixel electrode 311 to the third pixel electrode 313 to be a single piece. However, the HTL, the HIL, the ETL, or the EIL may be patterned in an island shape to correspond to each of the first pixel electrode 311 to the third pixel electrode 313.

The common electrode 330 may include a transmissive electrode or a reflective electrode. In some embodiments, the common electrode 330 may include a transparent or semi-transparent electrode, and may include a metal thin film having a small work function including lithium (Li), calcium (Ca), lithium fluoride/calcium (LiF/Ca), LiF/Al, Al, silver (Ag), magnesium (Mg), and compounds thereof. In addition, the common electrode 230 may further include a transparent conductive oxide (TCO) film, such as ITO, IZO, ZnO, $In_2O_3$, or the like, in addition to the metal thin film. The common electrode 330 may be integrally formed over the first pixel electrode 311 to the third pixel electrode 313.

An encapsulation layer (not shown) including a first inorganic encapsulation layer, a second inorganic encapsulation layer, and an organic encapsulation layer interposed therebetween may be disposed on the common electrode 330. The first inorganic encapsulation layer and the second inorganic encapsulation layer may each include $SiO_2$, $SiN_x$, SiON, $Al_2O_3$, $TiO_2$, $Ta_2O_5$, $HfO_2$, or ZnO. The organic encapsulation layer may include polyethylene terephthalate, polyethylene naphthalate, polycarbonate, polyimide, polyethylene sulfonate, polyoxymethylene, polyarylate, HMDSO, acrylic resin (e.g., PMMA, polyacrylic acid, and the like), or any combination thereof.

The first pixel electrode 311 is disposed in the first display area DA1, and is electrically connected to the first thin-film transistor TFT1 which is also disposed in the first display area DA1. The first pixel electrode 311 is electrically connected to the first thin-film transistor TFT1 through a contact hole formed in the protective layer 160 and the planarization layer 170. However, in some cases, the first pixel electrode 311 may be electrically connected to a bridge located between the protective layer 160 and the planarization layer 170 through a contact hole formed in the planarization layer 170, and that bridge may be electrically connected to the thin-film transistor TFT1 through the contact hole formed in the protective layer 160. This is the same for other pixel electrodes.

The second pixel electrode 312 is disposed in the second display area DA2 surrounding the first display area DA1 and is electrically connected to the second thin-film transistor TFT2 which is also disposed in the second display area DA2. The third pixel electrode 313 is disposed in the third display area DA3 surrounding the second display area DA2. However, the third pixel electrode 313 is electrically connected to the third thin-film transistor TFT3 disposed in the second display area DA2, not in the third display area DA3.

In the organic light-emitting display apparatus according to the present embodiment, a dead space where no display element is arranged may be drastically reduced.

Driver circuits or power supply wirings may be disposed adjacent to an edge of the substrate 100. In a display apparatus according to the related art, no display element is arranged where the driver circuits or the power supply wirings are arranged, and thus, the dead space increases.

However, in the display apparatus according to the present embodiment, the dead space may be drastically reduced. For example, as illustrated in FIG. 2, the third pixel electrode 313 in the third display area DA3 is electrically connected to the third thin-film transistor TFT3 arranged in the second display area DA2, not in the third display area DA3. Accordingly, a driver circuit or a power supply wiring can be located below the third pixel electrode 313, thus effectively preventing an increase in the dead space due to the driver circuit or the power supply wiring.

In FIG. 2, a driver circuit DC is disposed below the third pixel electrode 313. The driver circuit DC may generate, for example, a scan signal to be applied to a gate electrode of a switching thin-film transistor which is electrically connected to the pixel electrodes in the display area. In FIG. 2, for convenience, the driver circuit DC includes one thin-film transistor, but embodiments are not limited thereto. The driver circuit DC may include a plurality of thin-film transistors, and may include other electronic elements such as a capacitor.

Figure 3:
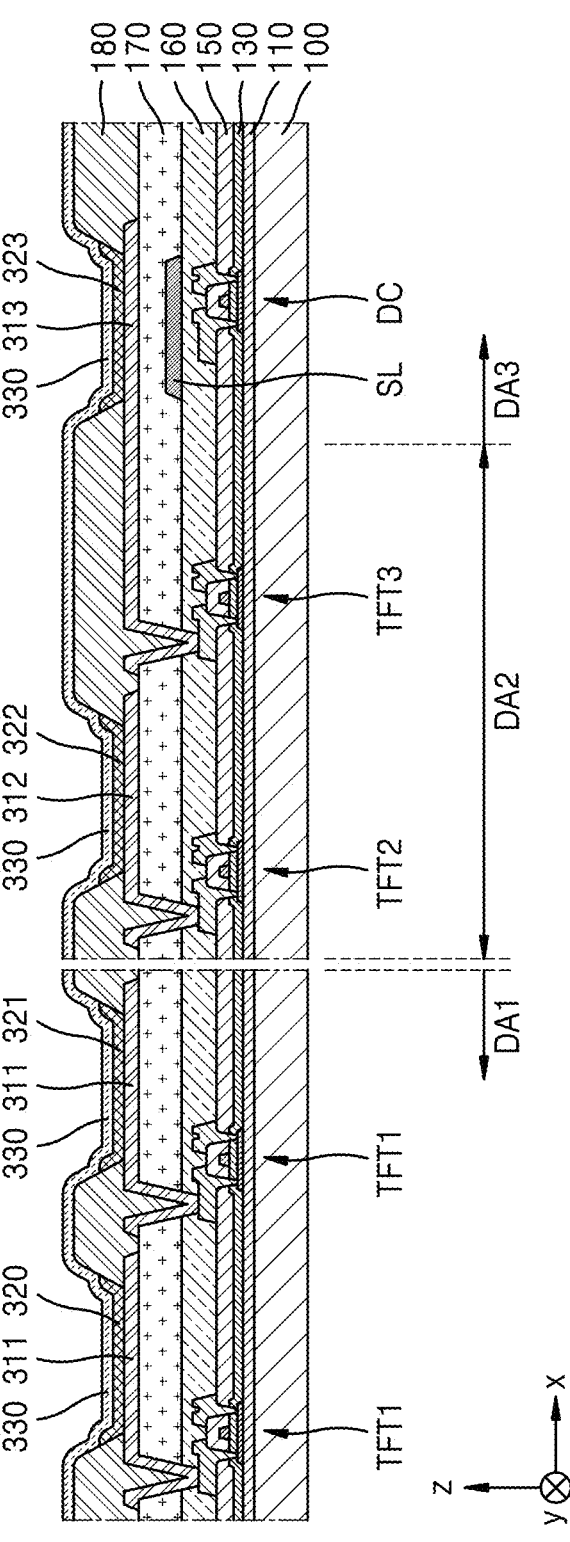
FIG. 3 is a cross-sectional view schematically illustrating a portion of a display apparatus according to another embodiment.

As the third pixel electrode 313 is disposed above the driver circuit DC to overlap the driver circuit DC in a plan view, the driver circuit DC may be affected by an electrical signal that is applied to the third pixel electrode 313. Therefore, as shown in FIG. 3, which is a cross-sectional view schematically illustrating a portion of a display apparatus, the display apparatus may further include a shielding layer SL to prevent the driver circuit DC from being affected by the electrical signal applied to the third pixel electrode 313. The shielding layer SL may be disposed between the driver circuit DC and the third pixel electrode 313 to prevent the driver circuit DC from being affected by the electrical signal applied to the third pixel electrode 313.

The shielding layer SL may be disposed between the protective layer 160 and the planarization layer 170. In this case, when other conductive layers such as a bridge disposed between the protective layer 160 and the planarization layer 170 are formed, the shielding layer SL may be formed of the same material as the other conductive layers. The shielding layer SL may completely cover the driver circuit DC in a plan view.

In order to ensure that the shielding layer SL prevents the driver circuit DC from being affected by the electrical signal applied to the third pixel electrode 313, a constant voltage may be applied to the shielding layer SL. For example, the shielding layer SL may be grounded. Alternatively, the shielding layer SL may be electrically connected to an electrode power supply line. As described above, the common electrode 330 overlaps the first pixel electrode 311 to the third pixel electrode 313, and a constant voltage is applied to that common electrode 330. A wiring that applies such voltage to the common electrode 330 may include an electrode power supply line electrically connected to the common electrode 330, and the shielding layer SL may be electrically connected to that electrode power supply line.

Figure 4:
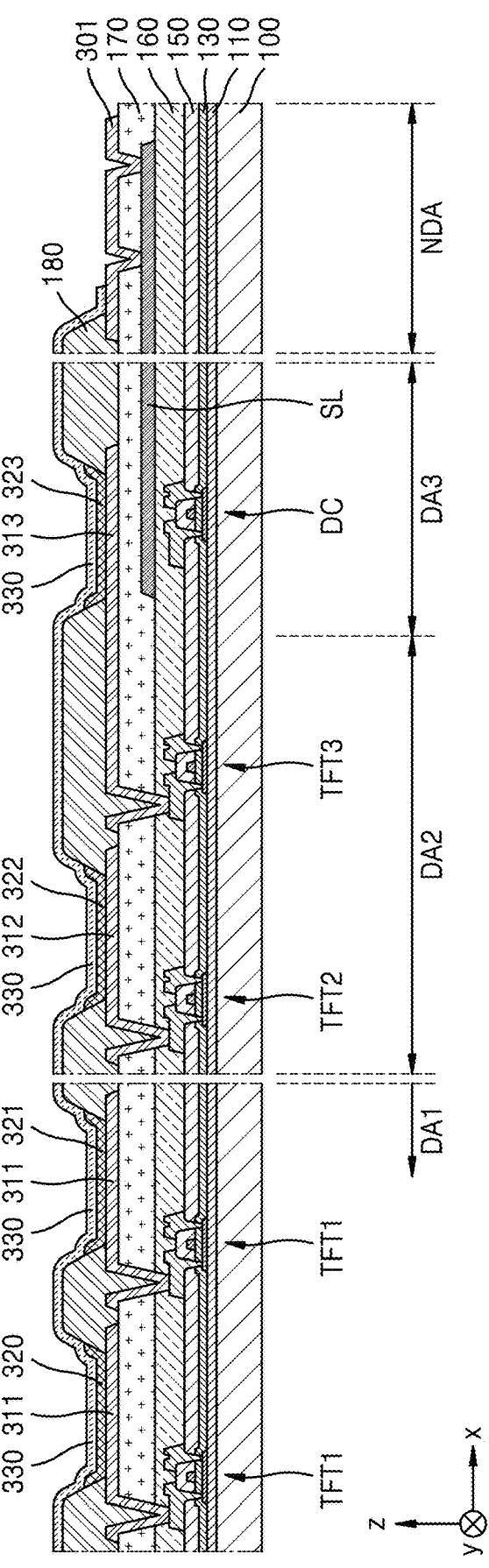
FIG. 4 is a cross-sectional view schematically illustrating a portion of a display apparatus according to another embodiment.

In some cases, as illustrated in FIG. 4, which is a cross-sectional view schematically illustrating a portion of a display apparatus according to another embodiment, the shielding layer SL may be part of the electrode power supply line. The electrode power supply line is electrically connected to the common electrode 330 in the non-display area NDA which surrounds the display area that includes the first to third display areas DA1 to DA3. The electrode power supply line may extend into the third display area DA3 to become the shielding layer SL located between the driver circuit DC and the third pixel electrode 313. The common electrode 330 may directly contact the electrode power supply line, but, as shown in FIG. 4, may be electrically connected to the electrode power supply line via a connection electrode 301 which is formed at the same time with the first pixel electrode 311. In this case, the connection electrode 301 is connected to the electrode power supply line through the contact hole formed in the planarization layer 170.

Meanwhile, the display apparatus may include a plurality of first pixel electrodes 311 in the first display area DA1, may include a plurality of second pixel electrodes 312 in the second display area DA2, and may include a plurality of third pixel electrodes 313 in the third display area DA3. As illustrated in FIGS. 2 to 4, the third pixel electrode 313 arranged in the third display area DA3 is electrically connected to the third thin-film transistor TFT3 arranged in the second display area DA2, not in the third display area DA3. To this end, the third pixel electrode 313 may extend to the second display area DA2 (in the −x direction) and be electrically connected to the third thin-film transistor TFT3.

Because the third thin-film transistor is disposed in the second display area DA2 and the third pixel electrode 313 extends to the second display area DA2 (in the −x direction), there is a need for securing a space in the second display area DA2 for the third thin-film transistor and the extension of the third pixel electrode 313. To this end, the number of second thin-film transistors TFT2 in the second display area DA2 may be limited. Accordingly, as shown in FIG. 5, which is a plan view schematically illustrating a portion of a display apparatus according to another embodiment, the number of the second pixel electrodes 312 arranged in the second display area DA2 per unit area may be less than the number of the first pixel electrodes 311 arranged in the first display area DA1 per unit area.

In addition, because the third pixel electrode 313 extends to the second display area DA2 (in the −x direction), there is a need for securing a space in the third display area DA3 to place such an extension, and further, because the third thin-film transistor TFT3 for controlling the third pixel electrode 313 is disposed in the second display area DA2, the number of third thin-film transistors TFT3 that may be arranged in the second display area DA2 may be limited too. Accordingly, as illustrated in FIG. 5, the number of the third pixel electrodes 313 in the third display area DA3 per unit area may be less than the number of the first pixel electrodes 311 in the first display area DA1 per unit area.

Meanwhile, it is desirable that, for example, a resolution of the second display area DA2 is the same as or greater than a resolution of the third display area DA3 and less than a resolution of the first display area DA1. This is because the less the resolution changes between the display areas, the greater the image quality displayed may be. Therefore, the number of the second pixel electrodes 312 in the second display area DA2 per unit area may be equal to or greater than the number of the third pixel electrodes 313 in the third display area DA3 per unit area.

Figure 5:
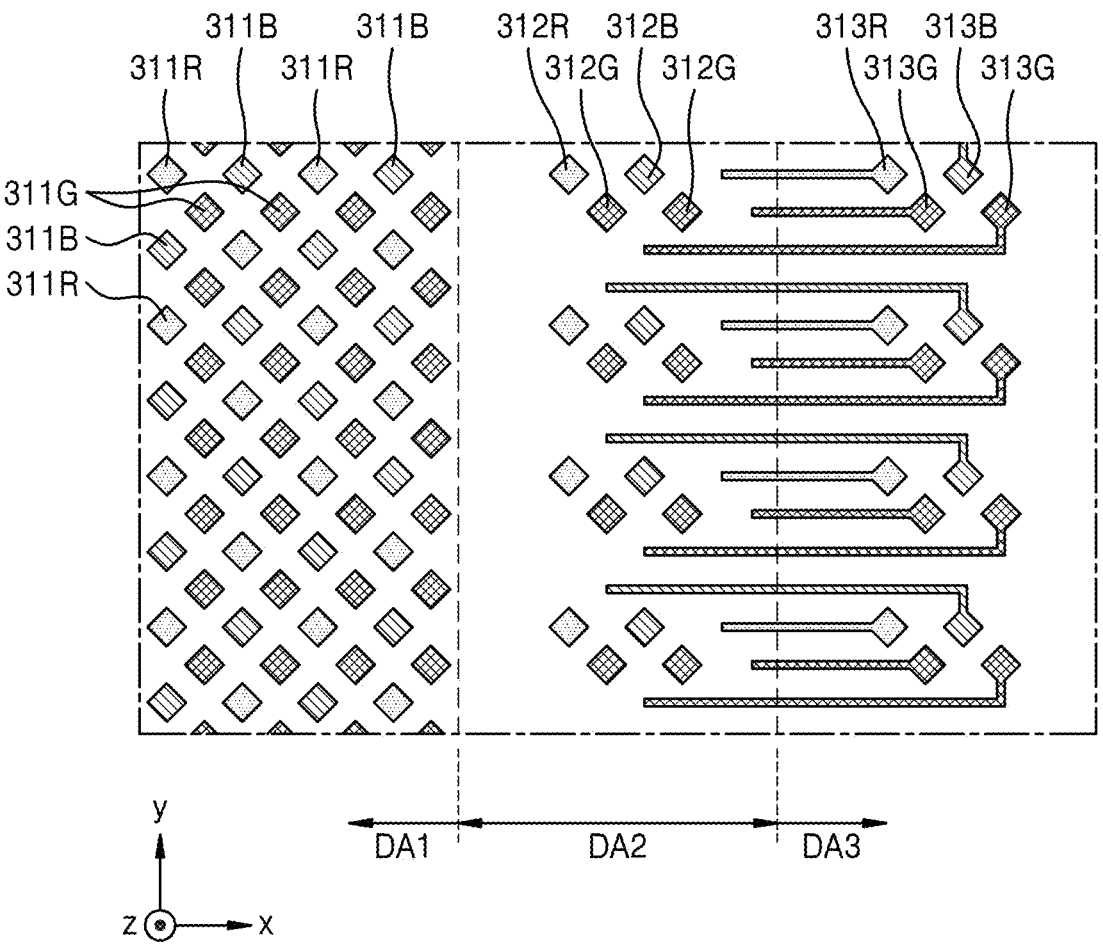
FIG. 5 is a plan view schematically illustrating a portion of a display apparatus according to another embodiment.

In FIG. 5, a set of a red second pixel electrode 312R, a green second pixel electrode 312G, a blue second pixel electrode 312B, and a green second pixel electrode 312G are repeatedly arranged in one direction (parallel to the y-axis)

in the second display area DA2 such that there is a space between the sets. Also in the third display area DA3, a set of a red third pixel electrode 313R, a green third pixel electrode 313G, a blue third pixel electrode 313B, and a green third pixel electrode 313G are repeatedly arranged in one direction (parallel to the y-axis) such that there is a space between the sets. In this case, a first red pixel electrode 311R and a blue first pixel electrode 311B are alternately arranged in one direction (parallel to the y-axis) in the first display area DA1, but the red second pixel electrodes 312R are arranged in one direction (parallel to the y-axis) in the second display area DA2, and the red third pixel electrodes 313R are arranged in one direction (parallel to the y-axis) in the third display area DA3.

Figure 6:
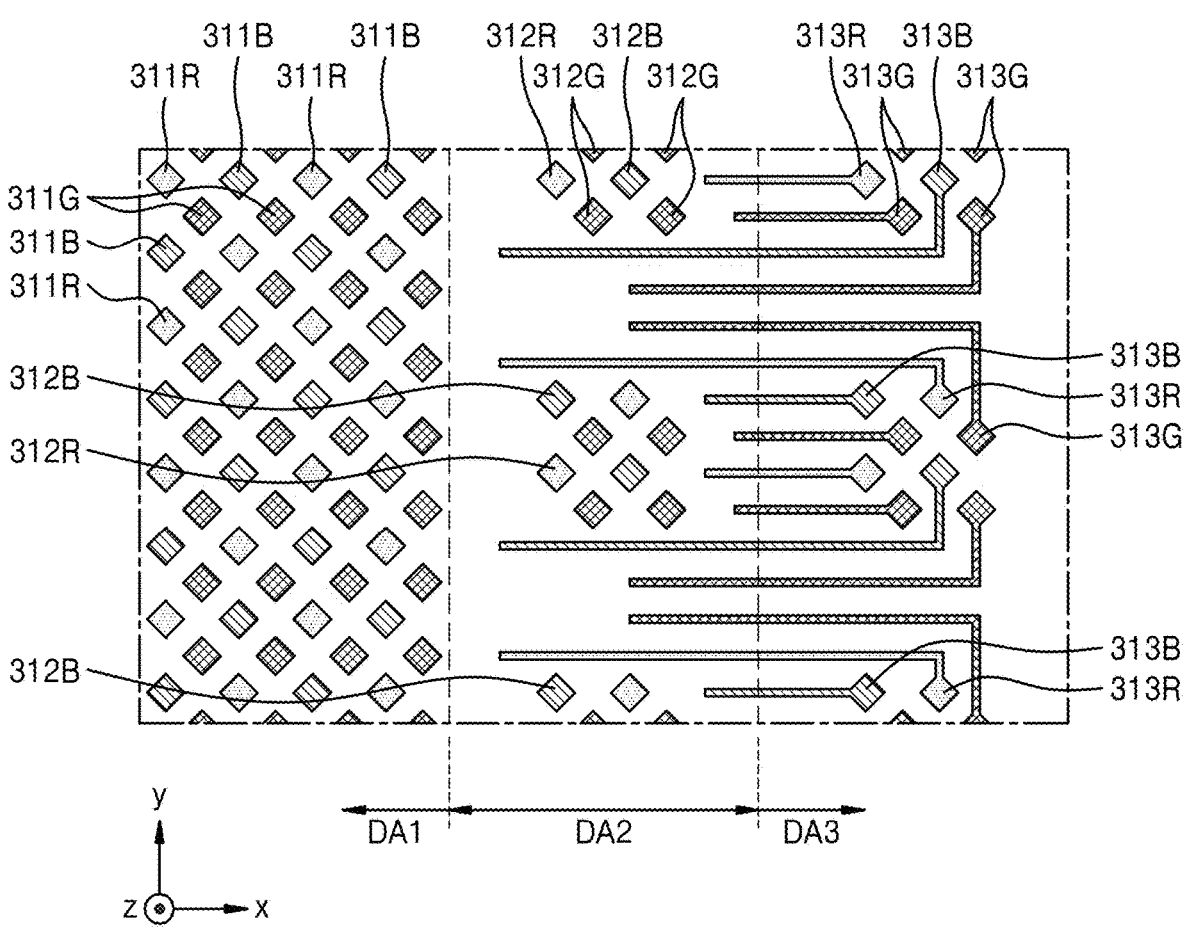
FIG. 6 is a plan view schematically illustrating a portion of a display apparatus according to another embodiment.

However, embodiments are not limited thereto. For example, as shown in FIG. 6, which is a plan view schematically illustrating a portion of a display apparatus according to another embodiment, a set including a subset of the blue second pixel electrode 312B, the green second pixel electrode 312G, the red second pixel electrode 312R, and the green second pixel electrode 312G and a subset of the red second pixel electrode 312R, the green second pixel electrode 312G, the blue second pixel electrode 312B, and the green second pixel electrode 312G may be repeatedly arranged in one direction (along the y-axis) in the second display area DA2 such that a space is present between the sets. Accordingly, in the second display area DA2 as well as the first display area DA1, the red second pixel electrode 312R and the blue second pixel electrode 312B may also be alternately arranged in one direction (parallel to the y-axis).

Similarly, in the third display area DA3, a set including a subset of the blue third pixel electrode 313B, the green third pixel electrode 313G, the red third pixel electrode 313R, and the green third pixel electrode 313G and a subset of the red third pixel electrode 313R, the green third pixel electrode 313G, the blue third pixel electrode 313B, and the green third pixel electrode 313G may be repeatedly arranged in one direction (parallel to the y-axis) such that a space is present between the sets. Accordingly, in the third display area DA3 as well as the first display area DA1, the red third pixel electrode 313R and the blue third pixel electrode 313B may also be alternately arranged in one direction (parallel to the y-axis).

Figure 7:
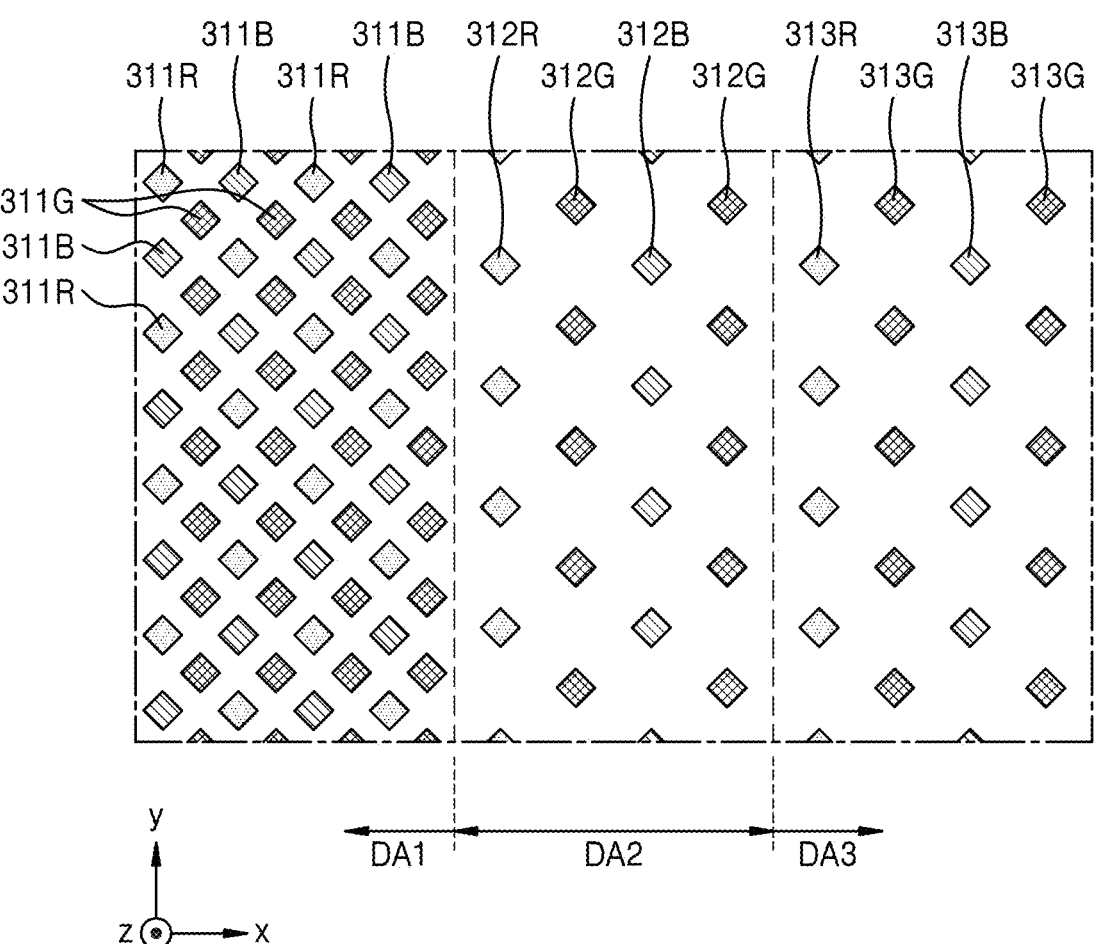
FIG. 7 is a plan view schematically illustrating a portion of a display apparatus according to another embodiment.

FIG. 7 is a plan view schematically illustrating a portion of a display apparatus according to another embodiment. In the display apparatus according to the present embodiment, similarly to the first pixel electrodes 311R, 311G, and 311B that are uniformly arranged in the first display area DA1, the second pixel electrodes 312R, 312G, and 312B are uniformly arranged in the second display area DA2, and the third pixel electrodes 313R, 313G, and 313B are uniformly arranged in the third display area DA3. Accordingly, high-quality images may be displayed not only in the first display area DA1 but also in the second display area DA2 and the third display area DA3. As illustrated in FIG. 6, the third pixel electrodes 313R, 313G, and 313B extend into the second display area DA2, and thus, the extensions of the third pixel electrodes 313R, 313G, and 313B are not shown in FIG. 7, for convenience of illustration. This is also the same in plan views illustrating embodiments to be described later below.

Meanwhile, as shown in FIGS. 2 to 7, the number of the second pixel electrodes 312 in the second display area DA2 per unit area is less than the number of the first pixel electrodes 311 in the first display area DA1 per unit area, and the number of the third pixel electrodes 313 in the third display area DA3 per unit area is less than the number of the first pixel electrodes 311 in the first display area DA1 per unit area. As a result, in order to emit light of the same or similar luminance as or to the first display area DA1 in the second display area DA2 and the third display area DA2, the amount of light emitted from each pixel of the second display area DA2 and the third display area DA3 should be greater than the amount of light emitted from each pixel of the first display area DA1. Thus, pixels in the second display area DA2 and the third display area DA3 may be deteriorated relatively faster than pixels in the first display area DA1.

Figure 8:
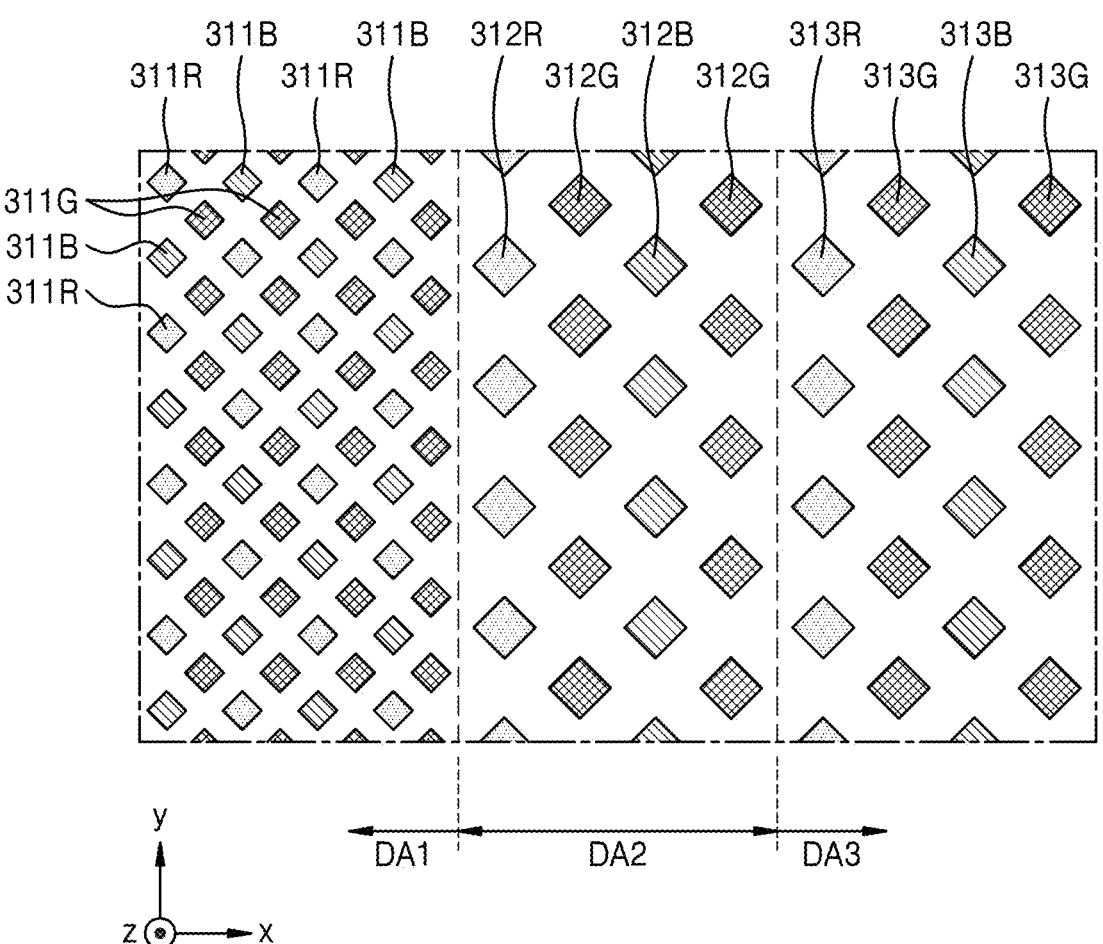
FIG. 8 is a plan view schematically illustrating a portion of a display apparatus according to another embodiment.

FIG. 8 is a plan view schematically illustrating a portion of a display apparatus according to another embodiment. As shown in FIG. 8, in the display apparatus according to the present embodiment, an area of each of the second pixel electrodes 312R, 312G, and 312B in the second display area DA2 is greater than an area of each of the first pixel electrodes 311R, 311G, and 311B in the first display area DA1. Similarly, an area of each of the third pixel electrodes 313R, 313G, and 313B in the third display area DA3 is greater than the area of each of the first pixel electrodes 311R, 311G, and 311B in the first display area DA1.

Through this, the amount of light emitted from each pixel in the second display area DA2 and the third display area is greater than the amount of light emitted from each pixel in the first display area DA1, and also, it is possible to prevent the pixels in the second display area DA2 and the third display area DA3 from being deteriorated faster than the pixels in the first display area DA1.

For reference, in one pixel set including a pixel emitting red light, a pixel emitting blue light, and a pixel emitting green light, an area of a pixel electrode of the pixel emitting red light, an area of a pixel electrode of the pixel emitting green light, and an area of a pixel electrode of the pixel emitting blue light may be different from one another. Therefore, the comparison of an area of the first pixel electrodes in the first display area DA1 with an area of the second pixel electrodes in the second display area DA2 described above with reference to FIG. 8 may include comparison of areas of pixels emitting light of the same wavelength. The same applies to the comparison of the area of the first pixel electrodes in the first display area DA1 with the area of the third pixel electrodes in the third display area DA3.

Figure 9:
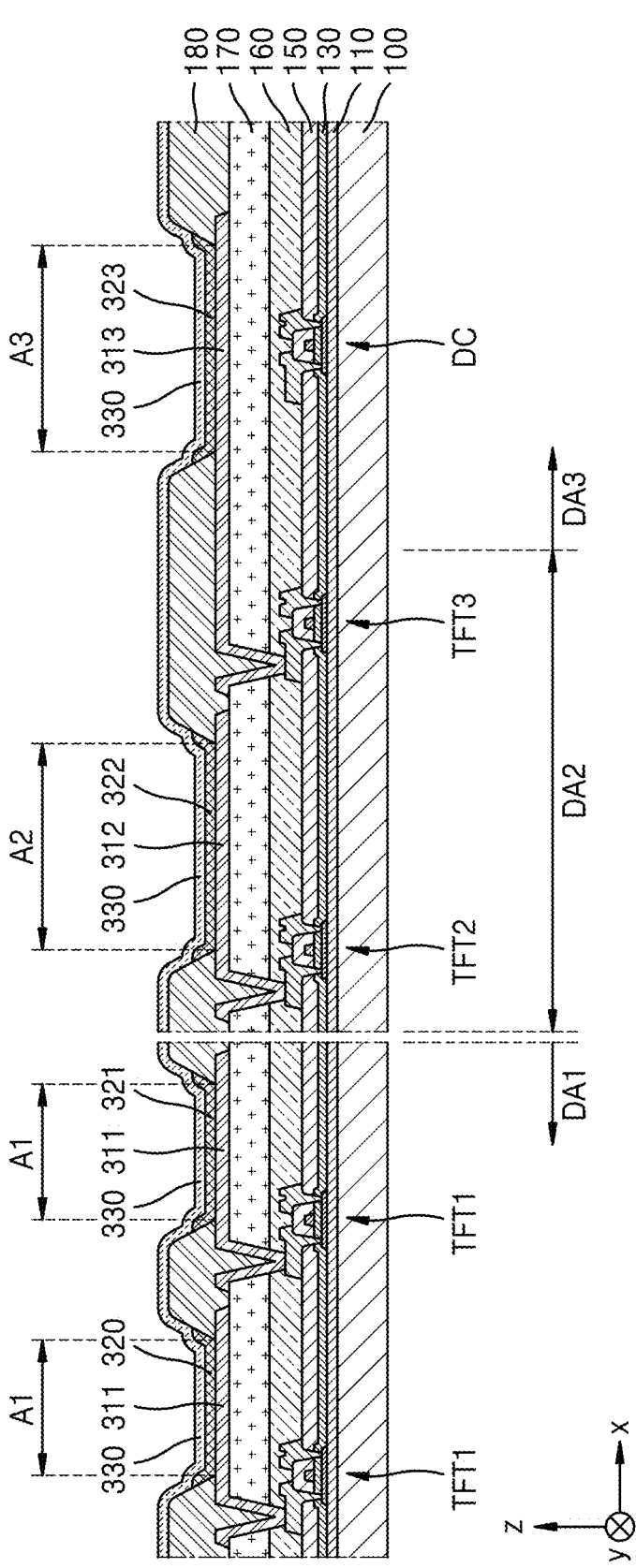
FIG. 9 is a cross-sectional view schematically illustrating a portion of a display apparatus according to another embodiment.

As described above, while the area of each of the second pixel electrodes 312R, 312G, and 312B in the second display area DA2 is greater than the area of each of the first pixel electrodes 311R, 311G, and 311B in the first display area DA1, it is also necessary to consider the area of openings of the pixel-defining layer 180 as shown in FIG. 9, which is a cross-sectional view schematically illustrating a portion of a display apparatus according to another embodiment. This is because the deterioration of the OLED means that an intermediate layer including an emission layer of the OLED is deteriorated. Therefore, an area of the intermediate layer including the emission layer may be considered.

As described above, the pixel-defining layer 180 may include openings for respectively exposing central portions of the pixel electrodes, thereby defining a light-emitting area of the pixel. In the display apparatus according to the present embodiment, an area A2 of a second opening of the pixel-defining layer 180 exposing a central portion of the second pixel electrode 312 is greater than an area A1 of a first opening of the pixel-defining layer 180 exposing a central portion of the first pixel electrode 311. Thus, an area of the second intermediate layer 322 disposed on the second pixel electrode 312 is also greater than an area of the first intermediate layer 320 or 321 disposed on the first pixel electrode 311. Through this, while the amount of light emitted from each pixel in the second display area DA2 is greater than the amount of light emitted from each pixel in the first display area DA1, the pixels of the second display area DA2 may be prevented from being deteriorated relatively faster than the pixels in the first display area DA1.

Similarly, an area A3 of a third opening of the pixel-defining layer 180 exposing a central portion of the third pixel electrode 313 is greater than the area A1 of the first opening of the pixel-defining layer 180 exposing the central portion of the first pixel electrode 311. Thus, an area of the third intermediate layer 323 disposed on the third pixel electrode 313 is also greater than an area of the first intermediate layer 320 or 321 disposed on the first pixel electrode 311. Through this, while the amount of light emitted from each pixel in the third display area DA3 is greater than the amount of light emitted from each pixel in the first display area DA1, the pixels of the third display area DA3 may be prevented from being deteriorated relatively faster than the pixels in the first display area DAL In the display apparatus according to this embodiment, in order to display images of uniform quality in the second display area DA2 and the third display area DA3, the area A3 of the third opening in the pixel-defining layer 180 exposing the central portion of the third pixel electrode 313 may be the same as the area A2 of the second opening in the pixel-defining layer 180 exposing the central portion of the second pixel electrode 312.

In one pixel set including a pixel emitting red light, a pixel emitting blue light, and a pixel emitting green light, an area of an opening of the pixel-defining layer 180 in the pixel emitting red light, an area of the pixel-defining layer 180 in the pixel emitting green light, and an area of an opening of the pixel-defining layer 180 in the pixel emitting blue light may be different from one another. Therefore, the comparison of the area A1 of the first opening in the first display area DA1 with the area A2 of the second opening in the second display area DA2 described above with reference to FIG. 9 may include comparison of areas of pixels emitting light of the same wavelength. The same applies to the comparison of the area A1 of the first opening in the first display area DA1 with the area of the third opening in the third display area DA3.

Figure 10:
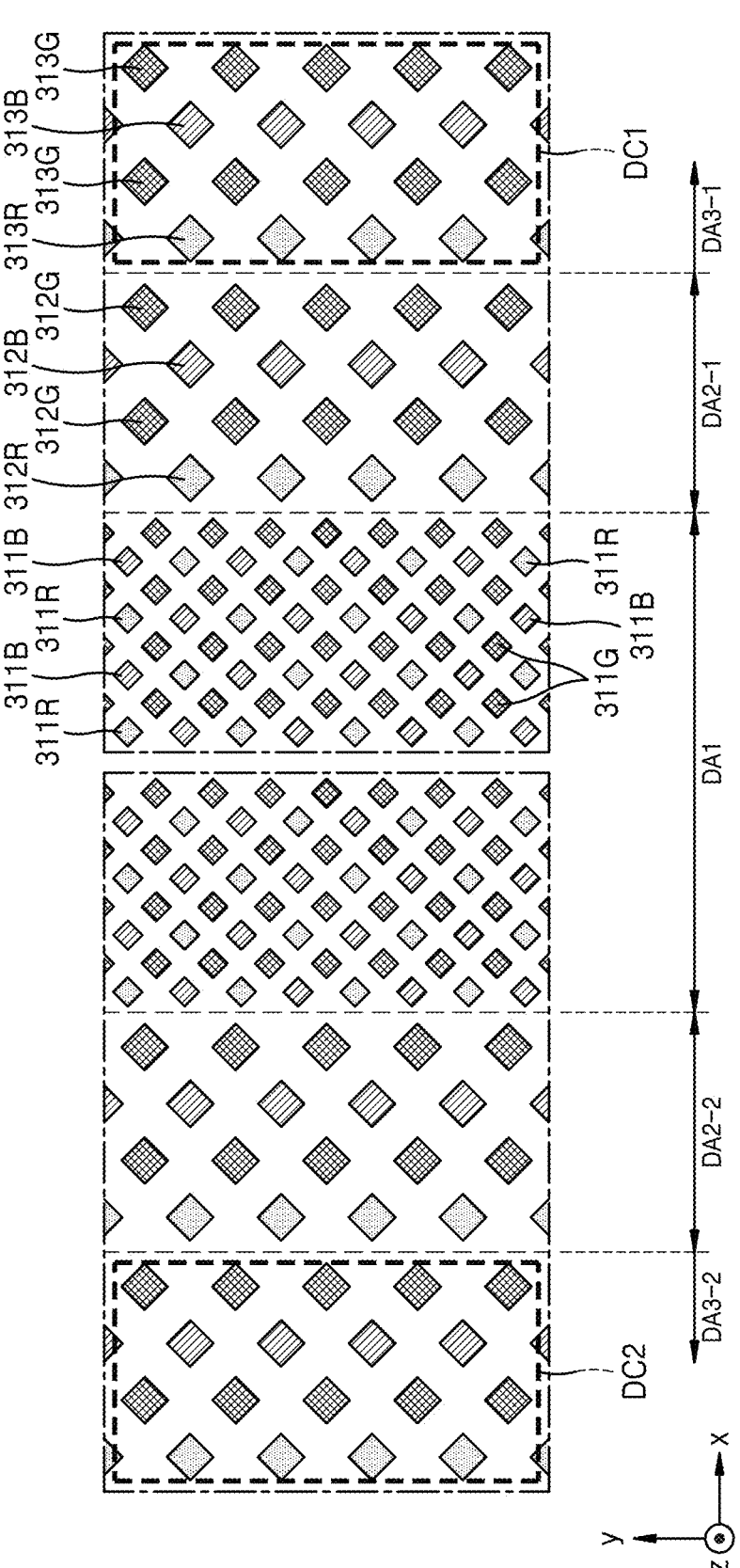
FIG. 10 is a plan view schematically illustrating a portion of a display apparatus according to another embodiment.

FIG. 10 is a plan view schematically illustrating a portion of a display apparatus according to another embodiment.

As shown in FIG. 10, the second display area DA2 surrounding the first display area DA1 may include a 2-1$^{st}$ display area DA2-1 abutting to one side of the first display area DA1, and a 2-2$^{nd}$ display area DA2-2 abutting to the other side of the first display area DA1, where the one side of the first display area DA1 is opposite to the other side of the first display area DA1 with respect to the center of the first display area DA1 Similarly, the third display area DA3 surrounding the second display area DA2 may include a 3-1$^{st}$ display area DA3-1 such that the 2-1$^e$ display area DA2-1 is disposed between the first display area DA1 and the 3-1$^{st}$ display area DA3-1, and a 3-2$^{nd}$ display area DA3-2 such that the 2-2$^{nd}$ display area DA2-2 is disposed between the first display area DA1 and the 3-2$^e$ display area DA 3-2.

The display apparatus may include a first driver circuit DC1 in the 3-1$^{st}$ display area DA3-1, and may include a second driver circuit DC2 in the 3-2$^{nd}$ display area DA3-2. In this case, some of the third pixel electrodes may be disposed above the first driver circuit DC1, and the rest of the third pixel electrodes may be disposed above the second driver circuit DC2. As a result, a dead space at both sides (in the +x and −x directions) of the first display area DA1 may be drastically reduced. The first driver circuit DC1 and the second driver circuit DC2 may generate or transmit an electrical signal applied to, for example, scan lines.

However, embodiments are not limited thereto. As shown in FIG. 1, the second display area DA2 may surround the first display area DA1, and the third display area DA3 may surround the second display area DA2. In this case, the second and third pixel electrodes may be arranged in a portion of the second display area DA2 and a portion of the third display area DA3 (in the −x direction and +x direction) with respect to the first display area DA1, and further, the second pixel electrodes and the third pixel electrodes may be arranged in a portion of the second display area DA2 and a portion of the third display area DA3 (in the −y direction and the +y direction). Through this, the dead space may be drastically reduced. However, the third pixel electrodes may be disposed in the outermost corner of the display apparatus.

According to an embodiment, an OLED apparatus in which an area of a dead space thereof may be reduced may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a substrate comprising a first display area and a second display area outside the first display area;
   a first thin-film transistor arranged in the first display area of the substrate;
   a second thin-film transistor arranged in the second display area of the substrate, the second thin-film transistor including a semiconductor layer, a source electrode, a drain electrode and a gate electrode;
   a first pixel electrode arranged in the first display area of the substrate and electrically connected to the first thin-film transistor;
   a second pixel electrode arranged in the second display area of the substrate, electrically connected to the second thin-film transistor arranged in the second display area, and not being electrically connected to the first thin-film transistor arranged in the first display area; and
   a pixel-defining layer having a first opening which exposes a portion of the first pixel electrode and a second opening which exposes a portion of the second pixel electrode,
   wherein, when viewed in a direction perpendicular to the substrate, the first thin film transistor overlaps the first opening of the pixel-defining layer and any thin-film transistor electrically connected to the second pixel electrode does not overlap the second opening of the pixel-defining layer.

2. The organic light-emitting display apparatus of claim 1, further comprising a first intermediate layer on the first pixel electrode and a second intermediate layer on the second pixel electrode, wherein the first pixel electrode is directly contacting the first intermediate layer in the first opening, and the second pixel electrode is directly contacting the second intermediate layer in the second opening.

3. The organic light-emitting display apparatus of claim 1, wherein a length of a second connecting part electrically connecting the portion of the second pixel electrode to the second thin-film transistor is longer than a length of a first connecting part electrically connecting the portion of the first pixel electrode to the first thin-film transistor.

4. The organic light-emitting display apparatus of claim 3, wherein, when viewed in the direction perpendicular to the substrate, the second connecting part overlaps the second thin-film transistor.

5. The organic light-emitting display apparatus of claim 1, wherein the first pixel electrode includes a plurality of first pixel electrodes arranged in the first display area and the second pixel electrode includes a plurality of second pixel electrodes arranged in the second display area.

6. The organic light-emitting display apparatus of claim 5, wherein number of the first pixel electrodes per unit area in the first display area is greater than number of the second pixel electrodes per unit area in the second display area.

7. The organic light-emitting display apparatus of claim 1, wherein an area of the second pixel electrode is greater than an area of the first pixel electrode.

8. The organic light-emitting display apparatus of claim 1, wherein an area of the second opening is greater than an area of the first opening.

9. The organic light-emitting display apparatus of claim 1, wherein the second display area surrounds the first display area.

10. The organic light-emitting display apparatus of claim 1, wherein the second opening is arranged outside the second thin-film transistor.

* * * * *